United States Patent
Kong et al.

(10) Patent No.: US 9,882,581 B2
(45) Date of Patent: Jan. 30, 2018

(54) COMPRESSIVE SENSING-BASED SIGNAL PROCESSING METHOD AND APPARATUS

(71) Applicant: Huawei Technologies Co., Ltd., Shenzhen (CN)

(72) Inventors: Xiangming Kong, Shenzhen (CN); Hufei Zhu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/270,911

(22) Filed: Sep. 20, 2016

(65) Prior Publication Data

US 2017/0012640 A1    Jan. 12, 2017

Related U.S. Application Data

(63) Continuation of application No. PCT/CN2014/073757, filed on Mar. 20, 2014.

(51) Int. Cl.
*H04B 1/66* (2006.01)
*H03M 7/30* (2006.01)
*H03M 1/12* (2006.01)

(52) U.S. Cl.
CPC ............ *H03M 7/3062* (2013.01); *H04B 1/66* (2013.01); *H03M 1/1255* (2013.01)

(58) Field of Classification Search
CPC ............................ H04N 7/50; H04N 7/26244
(Continued)

(56) References Cited

U.S. PATENT DOCUMENTS

| 6,384,773 B1 * | 5/2002 | Martin ................... G01S 7/282 342/159 |
| 8,032,085 B2 | 10/2011 | Mishali et al. |
| 8,958,750 B1 * | 2/2015 | Saleem ............. G06K 9/00516 455/62 |

FOREIGN PATENT DOCUMENTS

| CN | 101944961 A | 1/2011 |
| CN | 101951619 A | 1/2011 |

(Continued)

OTHER PUBLICATIONS

Mishali et al., "Sub-Nyquist Sampling: Bridging Theory and Practice," IEEE, Institute of Electrical and Electronics Engineers, New York, New York (Jun. 22, 2011).

(Continued)

*Primary Examiner* — Khai Tran
(74) *Attorney, Agent, or Firm* — Leydig, Voit & Mayer, Ltd.

(57) ABSTRACT

The present invention relates to a compressive sensing-based signal processing method and apparatus. The method includes: determining distribution, of signal components of an input signal on which frequency mixing has been performed, in a baseband spectrum according to spectral distribution of the input signal; dividing the baseband spectrum according to different signal aliasing patterns formed by the distribution of the signal components, to form multiple frequency bands; determining lowest sampling frequency of the input signal according to the signal aliasing patterns in the frequency bands, and performing sampling on the input signal at sampling frequency greater than the lowest sampling frequency, to obtain a sampled signal; and separately restoring a corresponding signal component in each frequency band of the multiple frequency bands according to the sampled signal, and splicing the signal components (Continued)

restored in the frequency bands, to complete restoration of the input signal.

14 Claims, 5 Drawing Sheets

(58) Field of Classification Search
 USPC .................. 375/240, 321, 353; 455/62, 67.13
 See application file for complete search history.

(56) References Cited

FOREIGN PATENT DOCUMENTS

| CN | 102082578 A | 6/2011 |
|----|-------------|--------|
| WO | 2013152022 A1 | 10/2013 |

OTHER PUBLICATIONS

Mishali et al., "Xampling: Signal Acquisition and Processing in Union of Subspaces," IEEE Transactions on Signal Processing, vol. 59, No. 10, pp. 1-16, Institute of Electrical and Electronics Engineers, New York, New York (2011).

Candés et al., "An introduction to Compressive Sampling," IEEE Signal Processing Magazine, pp. 21-30, Institute of Electrical and Electronics Engineers, New York, New York (Mar. 2008).

Tropp et al., "Beyond Nyquist: Efficient Sampling of Sparse Bandlimited Signals," IEEE Transactions on Information Theory, pp. 1-24, Institute of Electrical and Electronics Engineers, New York, New York (Jan. 30, 2009).

Mishali et al., "From Theory to Practice: Sub-Nyquist Sampling of Sparse Wideband Analog Signals," IEEE Journal of Selected Topics in Signal Processing, vol. 4, No. 2, pp. 375-391, Institute of Electrical and Electronics Engineers, New York, New York (Apr. 2010).

* cited by examiner

COMPRESSIVE SENSING-BASED SIGNAL PROCESSING METHOD AND APPARATUS

CROSS-REFERENCE TEMPLATES

This application is a continuation of International Application No. PCT/CN2014/073757, filed on Mar. 20, 2014, the disclosure of which is hereby incorporated by reference in its entirety.

TECHNICAL FIELD

The present invention relates to the field of communications technologies, and in particular, to a compressive sensing-based signal processing method and apparatus.

BACKGROUND

When a signal is sparse, a sampled signal always includes a large amount of redundant information, and the sampled signal needs to be compressed before the signal is saved and transmitted. Therefore, in 2006, persons such as Terence Tao and Donoho simultaneously came up with a concept of compressive sensing, that is, a sampling process is combined with a signal compression process, and a lowest sampling rate is directly determined, during sampling, according to a sparsity degree of a source signal, to perform sampling. Compressive sensing (compressive sensing) is a theory of performing signal reconstruction according to a sparse or compressible signal. A key to implementing compressive sensing is that a collected sample point can include as much information of a source signal as possible, that is, there is strong incoherence between a domain formed by sampling operators and a sparse domain of the signal. A lowest sampling rate determined according to the compressive sensing technology is generally lower than a Nyquist (Nyquist) rate, which greatly reduces complexity, costs, and power consumption of a sampling circuit. Especially with the constant increase in a frequency and a bandwidth of a communication signal, a conventional sampling circuit has become a vital bottleneck in the development of communications technologies, and therefore, it is particularly important to apply the compressive sensing technology to the communications field.

For a broadband analog communication signal with a sparsity feature, if sampling is directly performed by using a low-speed analog to digital converter (ADC), irreversible spectrum aliasing occurs in a signal, causing loss of information in the signal after the signal sampling. In an existing compressive sensing communications system, a structure of a random demodulator (RD) system or a modulated wideband converter (MWC) system is used, where sampling is performed after frequency mixing is first performed by using a random sequence, and then a signal is restored by using a restoration algorithm.

An existing RD system is only applicable to a signal whose frequency bins are discrete and whose frequency domain is sparse. For most communication signals having a continuous spectrum, sampling and restoration performed by using the RD system cause a relatively high restoration error, calculation complexity is very high, and a signal cannot be restored in real time. A random sequence used in the MWC system is a periodic sequence, a signal of each subband can be separately restored by using a signal restoration algorithm of the MWC system, and then complete restoration of the signal is implemented according to other related information. In an existing MWC system, because a subband bandwidth occupied by each signal is not distinguished in the system, a final sampling rate of the ADC is not determined by an actual total bandwidth of the signal but determined by a quantity of subbands occupied by the signal. Even if a bandwidth of a signal is far less than a width of a subband, because the signal occupies a subband, a sampling rate of the ADC is greatly increased. Especially because division of a subband is a fixed parameter of a system, and does not change with a signal, a frequency band boundary of the signal usually does not correspond to a subband boundary. Therefore, a signal whose frequency band width is less than a subband width spans two subbands, which causes an unnecessary increase in an ADC sampling rate.

SUMMARY

The present invention provides a compressive sensing-based signal processing method and apparatus, which can process more narrowband signals at a lower sampling rate, and can flexibly process various different frequency-domain sparse signals.

A first aspect of the present invention provides a compressive sensing-based signal processing method, where method includes:

determining distribution, of signal components of an input signal on which frequency mixing has been performed, in a baseband spectrum according to spectral distribution of the input signal;

dividing the baseband spectrum according to different signal aliasing patterns formed by the distribution of the signal components, to form multiple frequency bands, where each of the frequency bands corresponds to one signal aliasing pattern;

determining lowest sampling frequency of the input signal according to the signal aliasing patterns in the frequency bands, and performing sampling on the input signal at sampling frequency greater than the lowest sampling frequency, to obtain a sampled signal; and separately restoring a corresponding signal component in each frequency band of the multiple frequency bands according to the sampled signal, and splicing the signal components restored in the frequency bands, to complete restoration of the input signal.

With reference to the first aspect, in a first possible implementation manner of the first aspect, the determining lowest sampling frequency of the input signal according to the signal aliasing patterns in the frequency bands specifically includes:

determining a frequency band including a largest quantity of aliased signals among the frequency bands, and using lowest sampling frequency required by the frequency band including the largest quantity of aliased signals as the lowest sampling frequency of the input signal.

With reference to the first aspect or the first possible implementation manner of the first aspect, in a second possible implementation manner of the first aspect, the performing sampling on the input signal at sampling frequency greater than the lowest sampling frequency, to obtain a sampled signal is specifically:

performing sampling on the input signal at sampling frequency $f_s$, to obtain the sampled signal, where $$f_s \geq f_{s\_min} = \frac{Q \times f_p}{m},$$

$f_{s\_min}$ is the lowest sampling frequency, Q is a maximum quantity of aliased signals in the frequency band, $f_p$ is a subband bandwidth, and m is a channel quantity of a system.

With reference to the first aspect, in a third possible implementation manner of the first aspect, after the multiple frequency bands are formed, the method further includes:

determining a submatrix $A_S$, corresponding to an observation matrix A for compressive sensing sampling, in each frequency band of the multiple frequency bands according to the signal aliasing pattern in each frequency band of the multiple frequency bands, where i=1, . . . , K, where the separately restoring a corresponding signal component in each frequency band of the multiple frequency bands according to the sampled signal, and splicing the signal components restored in the frequency bands, to complete restoration of the entire input signal specifically includes:

separately restoring a baseband spectrum of the $i^{th}$ (i=1, . . . , K) frequency band according to a signal restoration algorithm formula $Z_{Si}(f)=A_{Si}^+y(f)$, where $A_S^+$ is a Moore Penrose inverse matrix of a submatrix $A_S$ of the $i^{th}$ frequency band, $Z_{Si}(f)$ is the restored baseband spectrum of the $i^{th}$ frequency band, y(f) is a discrete Fourier transformation of the sampled signal, and K is a total quantity of the frequency bands that are formed on the baseband spectrum; and splicing the restored baseband spectrums of the frequency bands, to obtain the entire baseband spectrum of the input signal, and restoring the input signal according to the baseband spectrum obtained through splicing.

With reference to the first aspect or any one of the first to third possible implementation manners of the first aspect, in a fourth possible implementation manner of the first aspect, before the determining distribution, of signal components of an input signal on which frequency mixing has been performed, in a baseband spectrum according to spectral distribution of the input signal, the method further includes:

detecting a previously received input signal, to obtain the spectral distribution of the input signal, and performing system configuration according to the spectral distribution of the input signal, where the performing system configuration according to the spectral distribution of the input signal specifically includes one of or a combination of more of the following:

configuring and adjusting the subband bandwidth $f_p$ of the system; or dynamically adjusting the subband bandwidth $f_p$ of the system; or adjusting the sampling frequency $f_s$ of a sampler; or adjusting a passband bandwidth of a filter; or configuring the channel quantity m.

According to a second aspect, the present invention further provides a compressive sensing-based signal processing apparatus, where apparatus includes:

a pre-processing unit, configured to determine distribution, of signal components of an input signal on which frequency mixing has been performed, in a baseband spectrum according to spectral distribution of the input signal; divide the baseband spectrum according to different signal aliasing patterns formed by the distribution of the signal components, to form multiple frequency bands on the baseband spectrum, where each of the frequency bands corresponds to one signal aliasing pattern; and determine lowest sampling frequency of the input signal according to the signal aliasing patterns in the frequency bands;

a sampling unit, configured to perform sampling on the input signal at sampling frequency greater than the lowest sampling frequency determined by the pre-processing unit, to obtain a sampled signal; and a reconstruction unit, configured to separately restore, according to the sampled signal obtained by the sampling unit, a corresponding signal component in each frequency band of the multiple frequency bands that are formed by the pre-processing unit, and splice the signal components restored in the frequency bands, to complete restoration of the input signal.

With reference to the second aspect, in a first possible implementation manner of the second aspect, the pre-processing unit is specifically configured to determine a frequency band including a largest quantity of aliased signals among the frequency bands, and use lowest sampling frequency required by the frequency band including the largest quantity of aliased signals as the lowest sampling frequency of the input signal.

With reference to the second aspect or the first possible implementation manner of the second aspect, in a second possible implementation manner of the second aspect, the sampling unit is specifically configured to perform sampling on the input signal at sampling frequency $f_s$, to obtain the sampled signal, where $$f_s \geq f_{s\_min} = \frac{Q \times f_p}{m},$$

$f_{s\_min}$ is the lowest sampling frequency, Q is a maximum quantity of aliased signals in the frequency band, $f_p$ is a subband bandwidth, and m is a channel quantity of a system.

With reference to the second aspect, in a third possible implementation manner of the second aspect, after the multiple frequency bands are formed on the baseband spectrum, the pre-processing unit is further configured to determine a submatrix $A_S$, corresponding to an observation matrix A for compressive sensing sampling, in each of the frequency bands according to the signal aliasing pattern in each frequency band of the multiple frequency bands, where i=1, . . . , K, where the reconstruction unit is specifically configured to separately restore a baseband spectrum of the $i^{th}$ (i=1, . . . , K) frequency band according to a signal restoration algorithm formula $Z_{Si}(f)=A_{Si}^+y(f)$, where $A_{Si}^+$ is a transposed matrix of a submatrix $A_{Si}$ of the $i^{th}$ frequency band, $Z_{Si}(f)$ is the restored baseband spectrum of the $i^{th}$ frequency band, y(f) is a to-be-restored signal, and K is a total quantity of the frequency bands that are formed on the baseband spectrum; and the reconstruction unit is further specifically configured to splice the restored baseband spectrums of the frequency bands, to obtain the entire baseband spectrum of the input signal, and restore the input signal according to the baseband spectrum obtained through splicing.

With reference to the second aspect or any one of the first to third possible implementation manners of the second aspect, in a fourth possible implementation manner of the second aspect, the pre-processing unit is further configured to detect a previously received input signal, to obtain the spectral distribution of the input signal, and perform system configuration according to the spectral distribution of the input signal, where the pre-processing unit is specifically configured to configure one of or a combination of more of the following:

configuring and adjusting the subband bandwidth $f_p$ of the system; or dynamically adjusting the subband bandwidth $f_p$ of the system; or adjusting the sampling frequency $f_s$ of a sampler; or adjusting a passband bandwidth of a filter; or configuring the channel quantity m.

With reference to the second aspect, in a fifth possible implementation manner of the second aspect, the compressive sensing-based signal processing apparatus is a base station or a terminal.

According to a third aspect, the present invention further provides a compressive sensing-based signal processing apparatus, where apparatus includes: a processor, a transceiver, and a memory; where the transceiver is configured to interact with another apparatus and receive an input signal;

the memory is configured to store a program; and the processor is configured to invoke the program stored in the memory, to perform the following steps:

determining distribution, of signal components of the input signal on which frequency mixing has been performed, in a baseband spectrum according to spectral distribution of the input signal;

dividing the baseband spectrum according to different signal aliasing patterns formed by the distribution of the signal components, to form multiple frequency bands, where each of the frequency bands corresponds to one signal aliasing pattern;

determining lowest sampling frequency of the input signal according to the signal aliasing patterns in the frequency bands, and performing sampling on the input signal at sampling frequency greater than the lowest sampling frequency, to obtain a sampled signal; and separately restoring a corresponding signal component in each frequency band of the multiple frequency bands according to the sampled signal, and splicing the signal components restored in the frequency bands, to complete restoration of the input signal.

With reference to the third aspect, in a first possible implementation manner of the third aspect, that the processor is configured to determine lowest sampling frequency of the input signal according to the signal aliasing patterns in the frequency bands specifically includes:

the processor is configured to:

determine a frequency band including a largest quantity of aliased signals among the frequency bands, and use lowest sampling frequency required by the frequency band including the largest quantity of aliased signals as the lowest sampling frequency of the input signal.

With reference to the third aspect or the first possible implementation manner of the third aspect, in a second possible implementation manner of the third aspect, that the processor is configured to perform sampling on the input signal at sampling frequency greater than the lowest sampling frequency, to obtain a sampled signal specifically includes:

the processor is configured to:

perform sampling on the input signal at sampling frequency $f_s$, to obtain the sampled signal, where $$f_s \geq f_{s\_min} = \frac{Q \times f_p}{m},$$

$f_{s\_min}$ is the lowest sampling frequency, Q is a maximum quantity of aliased signals in the frequency band, $f_p$ is a subband bandwidth, and m is a channel quantity of a system.

With reference to the third aspect, in a third possible implementation manner of the third aspect, after the multiple frequency bands are formed, the processor is further configured to:

determine a submatrix $A_{Si}$, corresponding to an observation matrix A for compressive sensing sampling, in each frequency band of the multiple frequency bands according to the signal aliasing pattern in each frequency band of the multiple frequency bands, where i=1, . . . , K, where that the processor is configured to separately restore a corresponding signal component in each frequency band of the multiple frequency bands according to the sampled signal, and splice the signal components restored in the frequency bands, to complete restoration of the entire input signal specifically includes:

the processor is configured to:

separately restore a baseband spectrum of the $i^{th}$ (i=1, . . . , K) frequency band according to a signal restoration algorithm formula $Z_{Si}(f)=A_{Si}^+ y(f)$, where $A_{Si}^+$ is a Moore Penrose inverse matrix of a submatrix $A_{Si}$ of the $i^{th}$ frequency band, $Z_{Si}(f)$ is the restored baseband spectrum of the $i^{th}$ frequency band, y(f) is a discrete Fourier transformation of the sampled signal, and K is a total quantity of the frequency bands that are formed on the baseband spectrum; and splice the restored baseband spectrums of the frequency bands, to obtain the entire baseband spectrum of the input signal, and restore the input signal according to the baseband spectrum obtained through splicing.

With reference to the third aspect or any one of the first to third possible implementation manners of the third aspect, in a fourth possible implementation manner of the third aspect, before determining the distribution, of the signal components of the input signal on which frequency mixing has been performed, in the baseband spectrum according to the spectral distribution of the input signal, the processor is further configured to:

detect a previously received input signal, to obtain the spectral distribution of the input signal, and perform system configuration according to the spectral distribution of the input signal, where the performing system configuration according to the spectral distribution of the input signal specifically includes one of or a combination of more of the following:

configuring and adjusting the subband bandwidth $f_p$ of the system; or dynamically adjusting the subband bandwidth $f_p$ of the system; or adjusting the sampling frequency $f_s$ of a sampler; or adjusting a passband bandwidth of a filter; or configuring the channel quantity m.

With reference to the third aspect, in a fifth possible implementation manner of the third aspect, the compressive sensing-based signal processing apparatus is a base station or a terminal.

According to the compressive sensing-based signal processing method and apparatus that are provided in the present invention, a baseband spectrum obtained after signal frequency mixing is analyzed, the baseband spectrum is divided into multiple frequency bands according to different signal aliasing patterns, and signals are restored by separately using different submatrices and then spliced. In this way, various different frequency-domain sparse signals can be processed, and signal sampling is performed at lower sampling frequency, which can reduce a quantity of required hardware channels; signal restoration is implemented in a case in which a sampling rate is relatively low; and more narrowband signals can be processed at a lower sampling rate.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

To make the invention objectives, features, and advantages of the present invention clearer and more comprehensible, the following describes the technical solutions in the embodiments of the present invention with reference to the accompanying drawings in the embodiments of the present invention. Apparently, the embodiments described are merely a part rather than all of the embodiments of the present invention. All other embodiments obtained by a person of ordinary skill in the art based on the embodiments of the present invention without creative efforts shall fall within the protection scope of the present invention.

A compressive sensing-based signal processing method and apparatus that are provided in the embodiments of the present invention can be applied to a compressive sensing-based communications system, and in particular, a compressive sensing-based receiver, and are used to process various different frequency-domain sparse signals, for example, communication signals with a relatively broad frequency that are formed by transmitting data information of a same user by using multiple frequency bands in a Long Term Evolution (Long Term Evolution, LTE) system, or communication signals of different frequency bands transmitted by multiple operators. The present invention is especially applicable to a scenario in which a quantity of hardware channels is less than a quantity of subbands that are occupied by a signal. Generally, benefits that can be brought by the present invention become more obvious when there is a smaller quantity of hardware channels.

Figure 1:
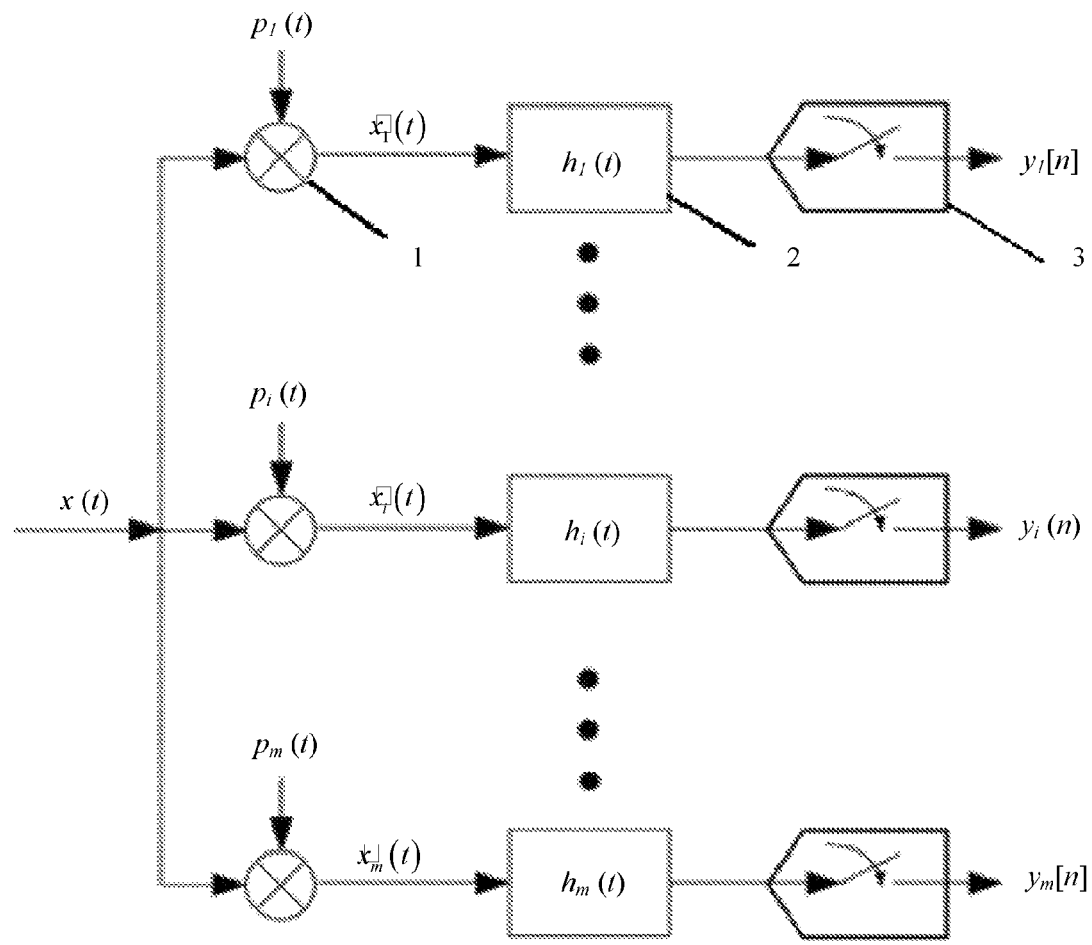
FIG. 1 is a schematic structural diagram of a modulated wideband converter system on which an embodiment of the present invention is based.

FIG. 1 is a schematic structural diagram of a modulated wideband converter system on which an embodiment of the present invention is based. The system is generally set in a receiver, and specifically includes a compressive collecting apparatus with m (1 . . . m) channels. Each channel includes a frequency mixer 1, a low-pass filter 2, and an ADC sampler 3. After frequency mixing is performed on input signals x (t) by frequency mixers 1 by using random periodic sequences (which include $p_i$ (t), . . . , and $p_m$ (t)), the input signals x (t) respectively pass through low-pass filters 2 ($h_1$ (t), . . . , and $h_m$ (t)), and then sampling is performed by ADC samplers 3, to obtain aliased sampled signals $y_1[n]$, . . . , and $y_m[n]$, and then signal restoration is performed by using a signal restoration algorithm, to restore the aliased sampled signals to signals sampled by a conventional ADC sampling apparatus, so as to implement complete restoration of the input signals.

In the embodiments of the present invention, a single-channel (m=1) compressive sensing-based communications system is used as an example for illustration; for cases in which there are multiple channels, similar extension may be made according to this, and the cases are not listed one by one herein in the present invention.

Embodiment 1

Figure 2:
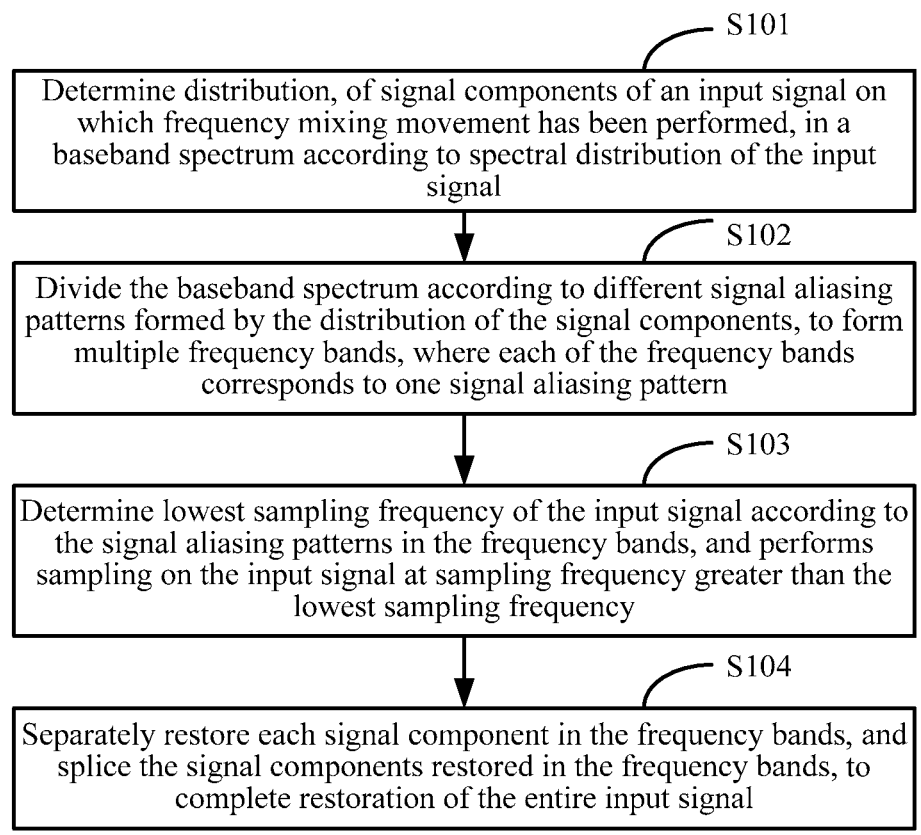
FIG. 2 is a flowchart of a compressive sensing-based signal processing method according to Embodiment 1 of the present invention.

As shown in FIG. 2, a compressive sensing-based signal processing method according to Embodiment 1 of the present invention includes:

S101: A receiver determines distribution, of signal components of an input signal on which frequency mixing has been performed, in a baseband spectrum according to spectral distribution of the input signal.

Figure 3A:
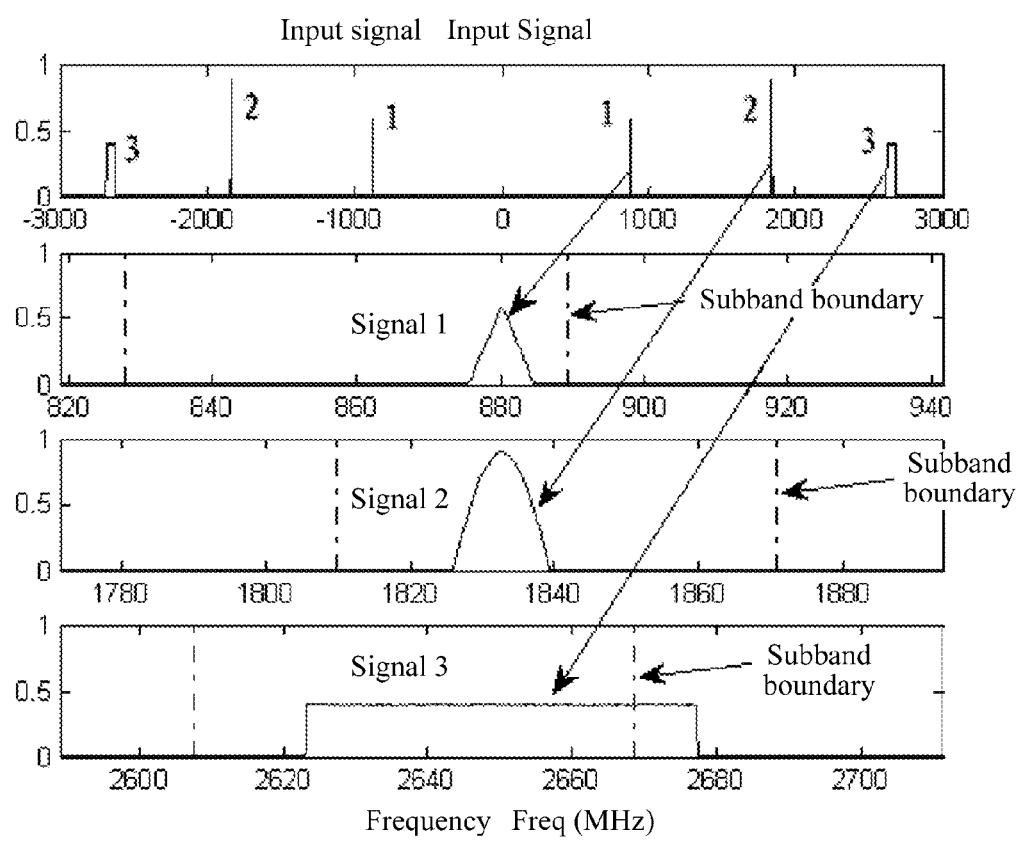
FIG. 3a shows spectrums when three communication signals are input.

The input signal is a radio frequency signal. Because transmission frequency bands corresponding to different operators are usually known signals, in this embodiment of the present invention, these known radio frequency signals are used as input signals for processing, that is, frequency bands occupied by the input signals are usually known. Therefore, according to a spectrum distribution of a known signal, a situation of distribution, of multiple signal components that are formed after frequency mixing has been performed on the signal, in a baseband spectrum may be estimated in advance. The input signal may include multiple discontinuous narrowband signals, as shown in FIG. 3a, including three communication signals: a signal 1, a signal 2, and a signal 3 that are symmetrical about the origin and whose center frequencies are respectively ±880 MHz, ±1832.5 MHz, and ±2.65 GHz and bandwidths are respectively 10 MHz, 15 MHz, and 60 MHz. A system can support a signal whose bandwidth reaches up to 2.98 G (a signal that is symmetrical about the origin), and an entire 5.95 G bandwidth may be divided into 97 subbands. Therefore, a bandwidth (that is, $f_p$) of each subband is 61.35 MHz=5.95 G/97. The three communication signals in FIG. 3a occupy a total of eight subbands, including subbands (about 830 MHz to 890 MHz, and about −890 MHz to −830 MHz) of the signal 1, subbands (about 1.81 GHz to 1.87 GHz, and −1.87 GHz to −1.81 GHz) of the signal 2, and subbands (2.61 GHz to 2.67 GHz, 2.67 GHz to 2.73 GHz, −2.67 GHz to −2.61 GHz, and −2.73 GHz to −2.67 GHz) of signal 3. Two sides of the signal 3 whose central frequency is ±2.65 GHz symmetrically span two subbands at both sides, and subband boundaries are at about ±2.67 GHz.

Because the spectrum of the input signal is known, the distribution, of the signal components of the input signal on which frequency mixing has been performed, in the baseband spectrum can be calculated in advance.

Frequency mixing is performed according to a characteristic of a periodic sequence, and there is a harmonic at a center of each subband, that is, a frequency-mixed signal includes multiple monophonies whose quantity is a multiple of the subband bandwidth fp. After the frequency mixing, each narrowband signal is moved to a baseband by a harmonic of a subband in which the narrowband signal is located (if the signal spans multiple subbands, a part of the signal in each subband is considered as a different signal), and the moved signals are aliased in the baseband. Distribution of frequencies of the signal in the baseband may be calculated according to a spectrum of each narrowband signal and a frequency of a central frequency bin of a subband in which each narrowband signal is located.

Figure 3B:
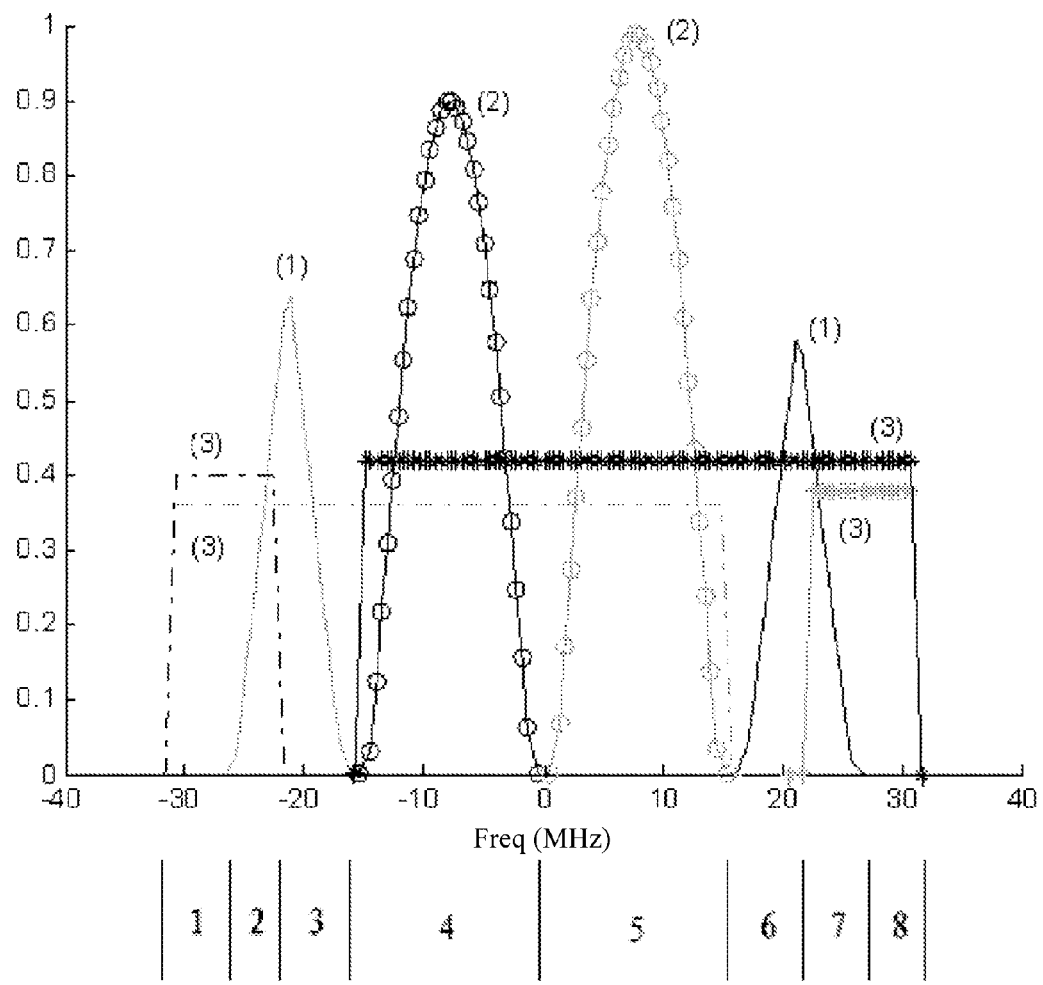
FIG. 3b shows baseband spectrums of the input signals in FIG. 3a on which frequency mixing has been performed.

FIG. 3b shows baseband spectrums of the three signals in FIG. 3a on which frequency mixing movement has been performed. After frequency mixing, the signal 1 is a signal represented by a solid line and a gray solid line that are marked with (1) in the figure on a baseband spectrum, where the solid line is a signal of a positive signal after frequency mixing, and the gray solid line is a signal of a negative signal after frequency mixing. After frequency mixing, the signal 2 is a signal represented by a solid line with circles and a gray solid line with circles that are marked with (2) in the figure on a baseband spectrum, where the solid line with circles is a signal of a positive signal after frequency mixing, and the gray solid line with circles is a signal of a negative signal after frequency mixing. The signal 3 spans two subbands, and after frequency mixing, the signal 3 is a signal represented by a dash-dot line, a gray dash-dot line, a jagged line, and a gray jagged line that are marked with (3) in the figure on a baseband spectrum, where the dash-dot line and the jagged line are signals of positive signals after frequency mixing, and the gray dash-dot line and the gray jagged line are signals of negative signals after frequency mixing.

Optionally, if the spectral distribution of the input signal is not explicit or clear, or in a case in which the input signal is dynamically distributed, in this embodiment of the present invention, the spectral distribution of the input signal may be determined according to a previously received input signal; and then the distribution, of the signal components of the input signal on which frequency mixing movement has been performed, in the baseband spectrum is determined according to the determined spectral distribution of the input signal, which specifically includes: detecting a previously received input signal, to obtain the spectral distribution of the input signal. After the spectral distribution of the input signal is determined, a system may be further configured according to the spectral distribution of the input signal. For example, a subband bandwidth $f_p$ of the system, sampling frequency of a sampler, and/or a passband bandwidth of a filter are configured or dynamically adjusted according to the spectral distribution of the input signal.

S102: The receiver divides the baseband spectrum according to different signal aliasing patterns formed by the distribution of the signal components, to form multiple frequency bands, where each of the frequency bands corresponds to one signal aliasing pattern.

Referring to FIG. 3b, it can be seen that different signals are aliased in different frequency bands of the baseband spectrum. The baseband spectrum may be divided into multiple frequency bands according to different signal aliasing patterns. Each line in the figure includes eight different signal aliasing patterns, and eight frequency bands may be obtained through division. Two signals (the dash-dot line and the gray dash-dot line) are aliased in the first frequency band, three signals (the dash-dot line, the gray dash-dot line, and the gray solid line) are aliased in the second frequency band, two signals (the gray dash-dot line and the gray solid line) are aliased in the third frequency band, three signals (the gray dash-dot line, the solid line with circles, and jagged line) are aliased in the fourth frequency band, three signals (the gray dash-dot line, the gray solid line with circles, and the jagged line) are aliased in the fifth frequency band, two signals (the solid line and the jagged line) are aliased in the sixth frequency band, three signals (the solid line, the jagged line, and the gray jagged line) are aliased in the seventh frequency band, and two signals (the jagged line and the gray jagged line) are aliased in the eighth frequency band. It can be seen that a maximum of three signals are aliased in one frequency band.

S103: The receiver determines lowest sampling frequency of the input signal according to the signal aliasing patterns in the frequency bands, and performs sampling on the input signal at sampling frequency greater than the lowest sampling frequency, to obtain a sampled signal.

The determining lowest sampling frequency of the input signal according to the signal aliasing patterns in the frequency bands specifically includes:

determining a frequency band including a largest quantity of aliased signals among the frequency bands, and using lowest sampling frequency required by the frequency band including the largest quantity of aliased signals as the lowest sampling frequency of the input signal.

If a maximum of $Q \leq N$ signals are aliased in each frequency band of the baseband spectrum, sampling frequency of an ADC needs to meet a condition that $f_s \geq Qf_p$. However, in an existing MWC system, sampling frequency of an ADC is $Nf_p$, where, usually, $Q<N$. It can be seen that the sampling frequency of the ADC in the present invention is lower than the sampling frequency of the MWC system in the prior art. Q is a maximum quantity of aliased signals in the frequency band of the baseband spectrum, $f_s$ is the sampling frequency, and $f_p$ is the subband bandwidth. As shown in FIG. 3b, it can be seen that a frequency band has aliased signals of a maximum of three subbands, which is, the second, fourth, fifth, and seventh frequency bands. Therefore, the determined lowest sampling frequency is $3f_p=184.05$ MHz, that is, in the present invention, the sampling frequency of the ADC only needs to meet a condition that $3f_p=184.05$ MHz. According to the existing MWC system, the sampling frequency of the ADC is at least $8f_p=490.8$ MHz. According to conventional Nyquist (that is, a sampling method that is not based on compressive sensing), a single-channel ADC needs to be used to perform sampling on the three signals, and the lowest sampling frequency is 2*(2.680 GHz−875 MHz)=2*1.805 GHz=3.61 GHz. Even if sampling is separately performed by using three ADCs after the three signals are separately demodulated to a base frequency by using three channels (three frequency mixers), total sampling frequency of the three ADCs also needs to reach (10 MHz+15 MHz+60 MHz)*2=85 M*2=170 MHz. Therefore, in the present invention, sampling may be performed on an input signal by using a single-channel hardware device (an m=1 compressive sampling apparatus) at a rate close to a lowest sampling rate.

For a system with m channels, the performing sampling on the input signal at sampling frequency greater than the lowest sampling frequency, to obtain a sampled signal is specifically:

performing sampling on the input signal at sampling frequency $f_s$, to obtain the sampled signal, where $$f_s \geq f_{s\_min} = \frac{Q \times f_p}{m},$$

$f_{s_{min}}$ is the lowest sampling frequency, Q is a maximum quantity of aliased signals in the frequency band, $f_p$ is a subband bandwidth, and m is a channel quantity of a system.

S104: The receiver separately restores a corresponding signal component in each frequency band of the multiple frequency bands according to the sampled signal, and splices the signal components restored in the frequency bands, to complete restoration of the input signal.

After the multiple frequency bands are formed on the baseband spectrum, the method further includes: determining a submatrix A, corresponding to an observation matrix $A_{Si}$, for compressive sensing sampling, in each frequency band of the multiple frequency bands according to the signal aliasing pattern in each frequency band of the multiple frequency bands, where i=1, ..., K.

If K frequency bands are formed on the baseband spectrum, a set of subbands in which a signal $f \in [f_{i1}, f_{i2})$ in the $i^{th}$ (i=1, ..., K) frequency band is located is $S_i$, a submatrix of an observation matrix corresponding to the $i^{th}$ (i=1, ..., K) frequency band is $A_{Si}$, and a baseband spectrum of a corresponding signal in the $i^{th}$ frequency band may be restored to $Z_{Si}(f) \geq A_{Si}^+ y(f)$.

The separately restoring a corresponding signal component in each frequency band of the multiple frequency bands according to the sampled signal, and splicing the signal components restored in the frequency bands, to complete restoration of the entire input signal specifically includes:

S1041: Separately restore a baseband spectrum of the $i^{th}$ (i=1, ..., K) frequency band according to a signal restoration algorithm formula $Z_{Si}(f) = A_{Si}^+ y(f)$.

$A_{Si}^+$ is a Moore Penrose inverse matrix of a submatrix $A_{Si}$ of the $i^{th}$ frequency band, $Z_{Si}(f)$ is the restored baseband spectrum of the $i^{th}$ frequency band, y(f) is a discrete Fourier transformation of the sampled signal, and K is a total quantity of the frequency bands that are formed on the baseband spectrum.

S1042: Splice the restored baseband spectrums of the frequency bands, to obtain the entire baseband spectrum of the input signal, and restore the input signal according to the baseband spectrum obtained through splicing.

The baseband spectrums of the K frequency bands calculated in step S1041 are spliced into the entire baseband spectrum by means of summation, and the input signal is restored according to the baseband spectrum obtained through splicing, so as to obtain a correct restored signal.

For a modulation manner in which data information is carried by using a frequency bin, such as orthogonal frequency division multiplexing (Orthogonal Frequency Division Multiplexing, OFDM), data information can be directly restored from a baseband spectrum without the need to restore a time-domain signal. For another modulation manner, a baseband frequency-domain signal may be converted into a time-domain sampled signal by means of discrete Fourier transformation (Discrete Fourier Transformation, DFT).

In this manner, according to the compressive sensing-based signal processing method provided in this embodiment of the present invention, a baseband spectrum obtained after signal frequency mixing is analyzed, the baseband spectrum is divided into multiple frequency bands according to different signal aliasing patterns, and signals are restored by separately using different submatrices and then spliced. In this way, various different frequency-domain sparse signals can be processed, and signal sampling is performed at lower sampling frequency, which can reduce a quantity of required hardware channels; signal restoration is implemented in a case in which a sampling rate is relatively low; and more narrowband signals can be processed at a lower sampling rate.

Embodiment 2

Figure 4:
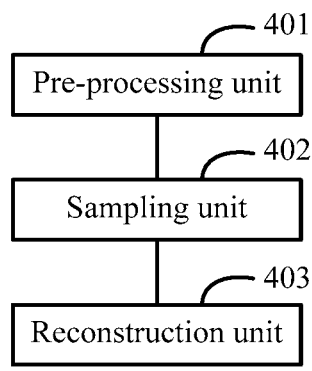
FIG. 4 is a schematic diagram of a compressive sensing-based signal processing apparatus according to Embodiment 2 of the present invention.

FIG. 4 is a schematic diagram of a compressive sensing-based signal processing apparatus according to this embodiment of the present invention. As shown in FIG. 4, the compressive sensing-based signal processing apparatus of the present invention includes: a pre-processing unit 401, a sampling unit 402, and a reconstruction unit 403.

The pre-processing unit 401 is configured to determine distribution, of signal components of an input signal on which frequency mixing has been performed, in a baseband spectrum according to spectral distribution of the input signal; divide the baseband spectrum according to different signal aliasing patterns formed by the distribution of the signal components, to form multiple frequency bands on the baseband spectrum, where each of the frequency bands corresponds to one signal aliasing pattern; and determine lowest sampling frequency of the input signal according to the signal aliasing patterns in the frequency bands.

The input signal is a radio frequency signal. Because transmission frequency bands corresponding to different operators are usually known signals, in this embodiment of the present invention, these known radio frequency signals are used as input signals for processing, that is, frequency bands occupied by the input signals are usually known. Therefore, according to a spectrum distribution of a known signal, the pre-processing unit 401 may estimate in advance a situation of distribution, of multiple signal components that are formed after frequency mixing has been performed on the signal, in a baseband spectrum. The input signal may include multiple discontinuous narrowband signals, as shown in FIG. 3a, including three channel signals that are centrally symmetrical about the origin. Because the spectrum of the input signal is known, the pre-processing unit 401 can calculate in advance the distribution, of the signal components of the input signal on which frequency mixing has been performed, in the baseband spectrum. As shown in FIG. 3b, it can be seen that different signals are aliased in different frequency bands of the baseband spectrum. The baseband spectrum may be divided into multiple frequency bands according to different signal aliasing patterns. Each line in the figure includes eight different signal aliasing patterns, and eight frequency bands may be obtained through division.

The pre-processing unit 401 determines a frequency band including a largest quantity of aliased signals among the frequency bands, and uses lowest sampling frequency required by the frequency band including the largest quantity of aliased signals as the lowest sampling frequency of the input signal.

If a maximum of Q≤N signals are aliased in each frequency band of the baseband spectrum, sampling frequency of an ADC needs to meet a condition that $f_s \geq Qf_p$. However, in an existing MWC system, sampling frequency of an ADC is N $f_p$, where, usually, Q<N. It can be seen that the sampling frequency of the ADC in the present invention is lower than the sampling frequency of the MWC system in the prior art. Q is a maximum quantity of aliased signals in the frequency band of the baseband spectrum, $f_s$ is the sampling frequency, and $f_p$ is a subband bandwidth. As shown in FIG. 3b, it can be seen that a frequency band has aliased signals of a maximum of three subbands, which is, the second, fourth, fifth, and seventh frequency bands. Therefore, the lowest sampling frequency determined by the pre-processing unit 401 is $3f_p$=184.05 MHz, that is, in the present invention, the sampling frequency of the ADC only needs to meet a condition that $3f_p$=184.05 MHz.

Optionally, if the spectral distribution of the input signal is not explicit or clear, or in a case in which the input signal is dynamically distributed, the pre-processing unit 401 may further determine the spectral distribution of the input signal according to a previously received input signal, and then determine the distribution, of the signal components of the input signal on which frequency mixing movement has been performed, in the baseband spectrum according to the determined spectral distribution of the input signal.

Specifically, the pre-processing unit 401 detects a previously received input signal, to obtain the spectral distribution of the input signal, and performs system configuration according to the spectral distribution of the input signal, and is specifically configured to configure one of or a combination of more of the following: configuring and adjusting the subband bandwidth $f_p$ of the system; or dynamically adjusting the subband bandwidth $f_p$ of the system; or adjusting the sampling frequency $f_s$ of a sampler; or adjusting a passband bandwidth of a filter; or configuring the channel quantity m.

The sampling unit 402 is configured to perform sampling on the input signal at sampling frequency greater than the lowest sampling frequency determined by the pre-processing unit 401, to obtain a sampled signal.

The sampling unit 402 is specifically configured to perform sampling on the input signal at sampling frequency $f_s$, to obtain the sampled signal, where $$f_s \geq f_{s\_min} = \frac{Q \times f_p}{m},$$

$f_{s\_min}$ is the lowest sampling frequency, Q is a maximum quantity of aliased signals in the frequency band, $f_p$ is the subband bandwidth, and m is a channel quantity of a system.

The reconstruction unit 403 is configured to separately restore, according to the sampled signal obtained by the sampling unit 402, a corresponding signal component in each frequency band of the multiple frequency bands that are formed by the pre-processing unit 401, and splice the signal components restored in the frequency bands, to complete restoration of the input signal.

Optionally, after the multiple frequency bands are formed on the baseband spectrum, the pre-processing unit 401 is further configured to: determine a submatrix A, corresponding to an observation matrix $A_{Si}$ for compressive sensing sampling, in each of the frequency bands according to the signal aliasing pattern in each frequency band of the multiple frequency bands, where i=1, . . . , K.

If K frequency bands are formed on the baseband spectrum, a set of subbands in which a signal $f \in [f_{i1}, f_{i2})$ in the $i^{th}$ (i=1, . . . , K) frequency band is located is $S_i$, a submatrix of an observation matrix corresponding to the $i^{th}$ (i=1, . . . , K) frequency band is $A_{Si}$, and a baseband spectrum of a corresponding signal in the $i^{th}$ frequency band may be restored to $Z_{Si}(f) \geq A_{Si}^+ y(f)$.

The reconstruction unit 403 is specifically configured to separately restore a baseband spectrum of the $i^{th}$ (i=1, . . . , K) frequency band according to a signal restoration algorithm formula $Z_{Si}(f) = A_{Si}^+ y(f)$, where $A_{Si}^+$ is a transposed matrix of a submatrix $A_{Si}$ of the $i^{th}$ frequency band, $Z_{Si}(f)$ is the restored baseband spectrum of the $i^{th}$ frequency band, y(f) is a to-be-restored signal, and K is a total quantity of the frequency bands that are formed on the baseband spectrum. The reconstruction unit 403 is further specifically configured to splice the restored baseband spectrums of the frequency bands, to obtain the entire baseband spectrum of the input signal, and restore the input signal according to the baseband spectrum obtained through splicing. The reconstruction unit 403 splices the calculated baseband spectrums of the K frequency bands into the entire baseband spectrum by means of summation, and restores the input signal according to the baseband spectrum obtained through splicing, so as to obtain a correct restored signal.

For a modulation manner in which data information is carried by using a frequency bin, such as orthogonal frequency division multiplexing (Orthogonal Frequency Division Multiplexing, OFDM), data information can be directly restored from a baseband spectrum without the need to restore a time-domain signal. For another modulation manner, a baseband frequency-domain signal may be converted into a time-domain sampled signal by means of discrete Fourier transformation (Discrete Fourier Transformation, DFT).

Embodiment 3

Figure 5:
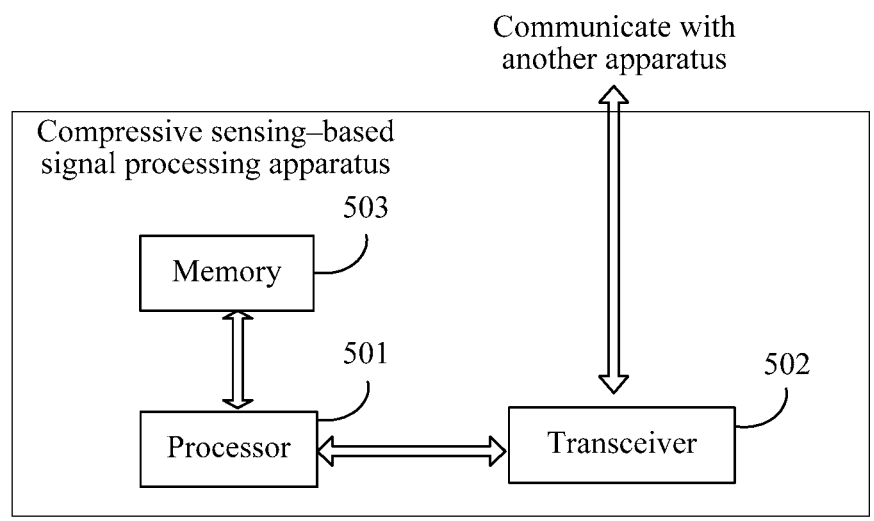
FIG. 5 is a schematic structural composition diagram of a compressive sensing-based signal processing apparatus according to Embodiment 3 of the present invention.

FIG. 5 is a schematic structural composition diagram of a compressive sensing-based signal processing apparatus according to this embodiment. As shown in FIG. 5, the compressive sensing-based signal processing apparatus of the present invention includes: a processor 501, a transceiver 502, and a memory 503.

The processor 501 may be a single-core or multi-core central processing unit (Central Processing Unit, CPU), or an application-specific integrated circuit (Application Specific Integrated Circuit, ASIC), or one or more integrated circuits configured to implement this embodiment of the present invention.

The transceiver 502 is configured to interact with another apparatus and receive an input signal.

The memory 503 is configured to store a program.

The processor 501 is configured to invoke the program stored in the memory 503, to perform the following steps:

determining distribution, of signal components of the input signal on which frequency mixing has been performed, in a baseband spectrum according to spectral distribution of the input signal;

dividing the baseband spectrum according to different signal aliasing patterns formed by the distribution of the signal components, to form multiple frequency bands, where each of the frequency bands corresponds to one signal aliasing pattern;

determining lowest sampling frequency of the input signal according to the signal aliasing patterns in the frequency bands, and performing sampling on the input signal at sampling frequency greater than the lowest sampling frequency, to obtain a sampled signal; and separately restoring a corresponding signal component in each frequency band of the multiple frequency bands according to the sampled signal, and splicing the signal components restored in the frequency bands, to complete restoration of the input signal.

Further, that the processor 501 is configured to determine lowest sampling frequency of the input signal according to the signal aliasing patterns in the frequency bands specifically includes:

the processor 501 is configured to:

determine a frequency band including a largest quantity of aliased signals among the frequency bands, and use lowest sampling frequency required by the frequency band including the largest quantity of aliased signals as the lowest sampling frequency of the input signal.

Further, that the processor 501 is configured to perform sampling on the input signal at sampling frequency greater than the lowest sampling frequency, to obtain a sampled signal specifically includes:

the processor 501 is configured to:

perform sampling on the input signal at sampling frequency $f_s$, to obtain the sampled signal, where $$f_s \geq f_{s\_min} = \frac{Q \times f_p}{m},$$

$f_{s\_min}$ is the lowest sampling frequency, Q is a maximum quantity of aliased signals in the frequency band, $f_p$ is a subband bandwidth, and m is a channel quantity of a system.

Further, after the multiple frequency bands are formed, the processor 501 is further configured to:

determine a submatrix A, corresponding to an observation matrix $A_{Si}$ for compressive sensing sampling, in each frequency band of the multiple frequency bands according to the signal aliasing pattern in each frequency band of the multiple frequency bands, where i=1, . . . , K, where that the processor 501 is configured to separately restore a corresponding signal component in each frequency band of the multiple frequency bands according to the sampled signal, and splice the signal components restored in the frequency bands, to complete restoration of the entire input signal specifically includes:

the processor 501 is configured to:

separately restore a baseband spectrum of the $i^{th}$ (i=1, . . . , K) frequency band according to a signal restoration algorithm formula $Z_{Si}(f)=A_{Si}^+ y(f)$, where $A_{Si}^+$ is a Moore Penrose inverse matrix of a submatrix $A_{Si}$ of the $i^{th}$ frequency band, $Z_{Si}(f)$ is the restored baseband spectrum of the $i^{th}$ frequency band, y(f) is a discrete Fourier transformation of the sampled signal, and K is a total quantity of the frequency bands that are formed on the baseband spectrum; and splice the restored baseband spectrums of the frequency bands, to obtain the entire baseband spectrum of the input signal, and restore the input signal according to the baseband spectrum obtained through splicing.

Further, before determining the distribution, of the signal components of the input signal on which frequency mixing has been performed, in the baseband spectrum according to the spectral distribution of the input signal, the processor 501 is further configured to detect a previously received input signal, to obtain the spectral distribution of the input signal, and perform system configuration according to the spectral distribution of the input signal.

Specifically, the compressive sensing-based signal processing apparatus further executes the signal processing method in Embodiment 1 according to the instruction. Details are not described herein again.

The compressive sensing-based signal processing apparatus provided in this embodiment of the present invention may be set in various communications devices, for example, a base station or a terminal, which is not limited in the present invention.

According to the compressive sensing-based signal processing method and apparatus that are provided in the present invention, a baseband spectrum obtained after signal frequency mixing is analyzed, the baseband spectrum is divided into multiple frequency bands according to different signal aliasing patterns, and signals are restored by separately using different submatrices and then spliced. In this way, various different frequency-domain sparse signals can be processed, and signal sampling is performed at lower sampling frequency, which can reduce a quantity of required hardware channels; signal restoration is implemented in a case in which a sampling rate is relatively low; and more narrowband signals can be processed at a lower sampling rate.

A person skilled in the art may be further aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

Steps of methods or algorithms described in the embodiments disclosed in this specification may be implemented by hardware, a software module executed by a processor, or a combination thereof. The software module may reside in a random access memory (RAM), a memory, a read-only memory (ROM), an electrically programmable ROM, an electrically erasable programmable ROM, a register, a hard disk, a removable disk, a CD-ROM, or any other form of storage medium known in the art.

In the foregoing specific implementation manners, the objective, technical solutions, and benefits of the present invention are further described in detail. It should be understood that the foregoing descriptions are merely specific implementation manners of the present invention, but are not intended to limit the protection scope of the present invention. Any modification, equivalent replacement, or improvement made without departing from the spirit and principle of the present invention should fall within the protection scope of the present invention.

What is claimed is:

1. A compressive sensing-based signal processing method, comprising:

determining distribution, of signal components of an input signal on which frequency mixing has been performed, in a baseband spectrum according to spectral distribution of the input signal;

dividing the baseband spectrum according to different signal aliasing patterns formed by the distribution of the signal components, to form multiple frequency bands, wherein each of the frequency bands corresponds to one signal aliasing pattern;

determining lowest sampling frequency of the input signal according to the signal aliasing patterns in the frequency bands, and performing sampling on the input signal at sampling frequency greater than the lowest sampling frequency, to obtain a sampled signal; and separately restoring a corresponding signal component in each frequency band of the multiple frequency bands according to the sampled signal, and splicing the signal components restored in the frequency bands, to complete restoration of the input signal.

2. The method according to claim 1, wherein the determining lowest sampling frequency of the input signal according to the signal aliasing patterns in the frequency bands comprises:

determining a frequency band comprising a largest quantity of aliased signals among the frequency bands, and using lowest sampling frequency required by the frequency band comprising the largest quantity of aliased signals as the lowest sampling frequency of the input signal.

3. The method according to claim 1, wherein the performing sampling on the input signal at sampling frequency greater than the lowest sampling frequency, to obtain a sampled signal is specifically:

performing sampling on the input signal at sampling frequency $f_s$, to obtain the sampled signal, wherein $$f_s \geq f_{s\_min} = \frac{Q \times f_p}{m},$$

$f_{s\_min}$ is the lowest sampling frequency, Q is a maximum quantity of aliased signals in the frequency band, $f_p$ is a subband bandwidth, and m is a channel quantity of a system.

4. The method according to claim 1, wherein after the multiple frequency bands are formed, the method further comprises:

determining a submatrix $A_{Si}$, corresponding to an observation matrix A for compressive sensing sampling, in each frequency band of the multiple frequency bands according to the signal aliasing pattern in each frequency band of the multiple frequency bands, wherein i=1, . . . , K, wherein the separately restoring a corresponding signal component in each frequency band of the multiple frequency bands according to the sampled signal, and splicing the signal components restored in the frequency bands, to complete restoration of the entire input signal specifically comprises:

separately restoring a baseband spectrum of the $i^{th}$ (i=1, . . . , K) frequency band according to a signal restoration algorithm formula $Z_{Si}(f)=A_{Si}^{+}y(f)$, wherein $A_{Si}^{+}$ is a Moore Penrose inverse matrix of a submatrix $A_{Si}$ of the $i^{th}$ frequency band, $Z_{Si}(f)$ is the restored baseband spectrum of the $i^{th}$ frequency band, y(f) is a discrete Fourier transformation of the sampled signal, and K is a total quantity of the frequency bands that are formed on the baseband spectrum; and splicing the restored baseband spectrums of the frequency bands, to obtain the entire baseband spectrum of the input signal, and restoring the input signal according to the baseband spectrum obtained through splicing.

5. The signal processing method according to claim 1, wherein before the determining distribution, of signal components of an input signal on which frequency mixing has been performed, in a baseband spectrum according to spectral distribution of the input signal, the method further comprises:

detecting a previously received input signal, to obtain the spectral distribution of the input signal, and performing system configuration according to the spectral distribution of the input signal, wherein the performing system configuration according to the spectral distribution of the input signal specifically comprises one of or a combination of more of the following:

configuring and adjusting a subband bandwidth $f_p$ of the system; or dynamically adjusting the subband bandwidth $f_p$ of the system; or adjusting a sampling frequency $f_s$ of a sampler; or adjusting a passband bandwidth of a filter; or configuring a channel quantity m.

6. The method according to claim 2, wherein the performing sampling on the input signal at sampling frequency greater than the lowest sampling frequency, to obtain a sampled signal is specifically:

performing sampling on the input signal at sampling frequency $f_s$, to obtain the sampled signal, wherein $$f_s \geq f_{s\_min} = \frac{Q \times f_p}{m},$$

$f_{s\_min}$ is the lowest sampling frequency, Q is a maximum quantity of aliased signals in the frequency band, $f_p$ is a subband bandwidth, and m is a channel quantity of a system.

7. The signal processing method according to claim 2, wherein before the determining distribution, of signal components of an input signal on which frequency mixing has been performed, in a baseband spectrum according to spectral distribution of the input signal, the method further comprises:

detecting a previously received input signal, to obtain the spectral distribution of the input signal, and performing system configuration according to the spectral distribution of the input signal, wherein the performing system configuration according to the spectral distribution of the input signal specifically comprises one of or a combination of more of the following:

configuring and adjusting a subband bandwidth $f_p$ of the system; or dynamically adjusting the subband bandwidth $f_p$ of the system; or adjusting a sampling frequency $f_s$ of a sampler; or adjusting a passband bandwidth of a filter; or configuring a channel quantity m.

8. The signal processing method according to claim 3, wherein before the determining distribution, of signal components of an input signal on which frequency mixing has been performed, in a baseband spectrum according to spectral distribution of the input signal, the method further comprises:

detecting a previously received input signal, to obtain the spectral distribution of the input signal, and performing system configuration according to the spectral distribution of the input signal, wherein the performing system configuration according to the spectral distribution of the input signal specifically comprises one of or a combination of more of the following:
configuring and adjusting the subband bandwidth $f_p$ of the system; or
dynamically adjusting the subband bandwidth $f_p$ of the system; or
adjusting the sampling frequency $f_s$ of a sampler; or
adjusting a passband bandwidth of a filter; or
configuring the channel quantity m.

9. A compressive sensing-based signal processing apparatus, wherein the apparatus comprises:
a transceiver configured to receive an input signal;
at least one processor; and
a memory coupled to the at least one processor and configured to store instructions which, when executed by the at least one processor, causes the at least one processor to:
determine distribution, of signal components of the input signal on which frequency mixing has been performed, in a baseband spectrum according to spectral distribution of the input signal;
divide the baseband spectrum according to different signal aliasing patterns formed by the distribution of the signal components, to form multiple frequency bands, wherein each of the frequency bands corresponds to one signal aliasing pattern;
determine lowest sampling frequency of the input signal according to the signal aliasing patterns in the frequency bands, and performing sampling on the input signal at sampling frequency greater than the lowest sampling frequency, to obtain a sampled signal; and
separately restore a corresponding signal component in each frequency band of the multiple frequency bands according to the sampled signal, and splicing the signal components restored in the frequency bands, to complete restoration of the input signal.

10. The apparatus according to claim 9, wherein that the processor is operable to execute the instructions to:
determine a frequency band comprising a largest quantity of aliased signals among the frequency bands, and use lowest sampling frequency required by the frequency band comprising the largest quantity of aliased signals as the lowest sampling frequency of the input signal.

11. The apparatus according to claim 9, wherein that the processor is configured to perform sampling on the input signal at sampling frequency greater than the lowest sampling frequency, to obtain a sampled signal comprises:
the processor is configured to:
perform sampling on the input signal at sampling frequency $f_s$, to obtain the sampled signal, wherein $$f_s \geq f_{s\_min} = \frac{Q \times f_p}{m},$$

$f_{s\_min}$ is the lowest sampling frequency, Q is a maximum quantity of aliased signals in the frequency band, $f_p$ is a subband bandwidth, and m is a channel quantity of a system.

12. The apparatus according to claim 9, wherein after the multiple frequency bands are formed, the processor is further configured to: determine a submatrix $A_{Si}$, corresponding to an observation matrix A for compressive sensing sampling, in each frequency band of the multiple frequency bands according to the signal aliasing pattern in each frequency band of the multiple frequency bands, wherein i=1, ..., K, wherein
that the processor is configured to separately restore a corresponding signal component in each frequency band of the multiple frequency bands according to the sampled signal, and splice the signal components restored in the frequency bands, to complete restoration of the entire input signal comprises:
the processor is configured to:
separately restore a baseband spectrum of the $i^{th}$ (i=1, ..., K) frequency band according to a signal restoration algorithm formula $Z_{Si}(f)=A_{Si}^{+}y(f)$, wherein $A_{Si}^{+}$ is a Moore Penrose inverse matrix of a submatrix $A_{Si}^{+}$ of the ith frequency band, $Z_{Si}(f)$ is the restored baseband spectrum of the $i^{th}$ frequency band, y(f) is a discrete Fourier transformation of the sampled signal, and K is a total quantity of the frequency bands that are formed on the baseband spectrum; and
splice the restored baseband spectrums of the frequency bands, to obtain the entire baseband spectrum of the input signal, and restore the input signal according to the baseband spectrum obtained through splicing.

13. The apparatus according to claim 9, wherein before determining the distribution, of the signal components of the input signal on which frequency mixing has been performed, in the baseband spectrum according to the spectral distribution of the input signal, the processor is further configured to:
detect a previously received input signal, to obtain the spectral distribution of the input signal, and perform system configuration according to the spectral distribution of the input signal, wherein
the performing system configuration according to the spectral distribution of the input signal specifically comprises one of or a combination of more of the following:
configuring and adjusting a subband bandwidth $f_p$ of the system; or
dynamically adjusting the subband bandwidth $f_p$ of the system; or
adjusting a sampling frequency $f_s$ of a sampler; or
adjusting a passband bandwidth of a filter; or
configuring a channel quantity m.

14. The apparatus according to claim 9, wherein the compressive sensing-based signal processing apparatus is a base station or a terminal.

* * * * *